United States Patent [19]

Wolfgang

[11] Patent Number: 5,422,786
[45] Date of Patent: Jun. 6, 1995

[54] DEVICE FOR HEAT REMOVAL FROM THE INTERIOR OF A CONTROL CABINET OF A TEXTILE MACHINE

[75] Inventor: Jaeger Wolfgang, Göppingen, Germany

[73] Assignee: Rieter Ingolstadt Spinnereimaschinenbau AG, Ingolstadt, Germany

[21] Appl. No.: 238,304

[22] Filed: May 5, 1994

[30] Foreign Application Priority Data

May 21, 1993 [DE] Germany .................. 43 16 999.6

[51] Int. Cl.6 ............................................. H05K 7/20
[52] U.S. Cl. ..................................... 361/690; 361/725
[58] Field of Search .............................. 361/687–697, 361/707–716, 724–727, 730

[56] References Cited

U.S. PATENT DOCUMENTS 4,122,508 10/1978 Rumbaugh .
4,699,208 10/1987 Wolf et al. .
5,218,516 6/1993 Collins et al. .

FOREIGN PATENT DOCUMENTS 0219134 4/1987 European Pat. Off. ............ 361/688
0478993A1 4/1992 European Pat. Off. .
3438206A1 4/1986 Germany .
3609037A1 10/1986 Germany .
3517149A1 11/1986 Germany .
4015030C1 11/1991 Germany .

OTHER PUBLICATIONS

European search report with translation.
IBM Technical Disclosure Bulletin, Apr., 1978, vol. 20, No. 11A.

Primary Examiner—Gregory D. Thompson
Attorney, Agent, or Firm—Dority & Manning

[57] ABSTRACT

The invention relates to a device for heat removal from the interior space of a control cabinet of a textile machine for spinning or winding. The invention reduce the sophistication of the design for the heat removal from interior spaces of a control cabinet of a textile machine for spinning or winding which is heated by the operation of electric and electronic instrument. It is a characteristic of the invention that the cooling air channel (K) is constituted by several tube-shaped segments (Q2, Q2, Q3, Q4). A pipe-shaped segment (Q1) is formed by the arrangement of two inverting rectifier modules (30, 31) in the horizontal plane of a frame (13) of the control cabinet (12).

8 Claims, 7 Drawing Sheets

DEVICE FOR HEAT REMOVAL FROM THE INTERIOR OF A CONTROL CABINET OF A TEXTILE MACHINE

BACKGROUND OF THE INVENTION

The instant invention relates to a device for heat removal from the interior of a control cabinet of a textile machine. A textile machine is understood to be a machine for spinning or winding. This may be a carding machine, a draw frame, flyer spinning machine or winding machine. In the interior of the control cabinet with which each of these textile machines electrical and electronic instruments for the operation of the textile machine are installed and may heat the interior space to an unacceptable degree so that increased air temperature may adversely affect the operation of the electrical and electronic instruments. Cooling devices are designed to avoid this problem by removing the heat from the interior space.

Electrical and electronic instruments emitting operating heat are, for example, power electronics instruments. Power electronics deal with the control and transformation of the electrical power flow by means of electronic components such as thyristors and power transistors. During the operation of these electronic components, heat resulting from the dissipated electrical energy of the components is produced and is transmitted to the surrounding air of the interior space. For this purpose, these components have been provided with cooling elements. The cooling elements increase the effective cooling surface of the component, as these cooling elements generally have the profile of cooling ribs. In power electronics devices, the power and information electronics are as a rule housed together. The power electronics themselves are combined together with their electronic controls into one functional unit. This is a modular design. An inverted rectifier controlling an electric motor is, for example, designed in modular form. It is called an inverted rectifier module. Such inverted rectifier modules in particular cause the interior space to heat up. If the air temperature inside the control cabinet reaches unacceptable values, the functioning of electronic components, in particular those of information electronics, are adversely influenced. The functioning of the textile machine is then impaired.

In order to remove the heat from the interior of the control cabinet of a textile machine, a cooling device is used. The cooling device is a device wherein the heat exchange between cooling element of the electrical/electronic instrument and the cooling medium air takes place and the heated cooling air is removed. Such a cooling device is to be understood in particular to be a cooling air channel with cooling elements.

DE-OS 35 17 149 describes a cooling device for the removal of heat from an interior space in which heat-producing electrical or electronic components are installed. The interior space is formed by the housing of a control cabinet for power electronics. This housing has a cooling air channel whereby the cooling body (i.e. a metallic ribbed element) is mounted on the individual side wall of the cooling air channel. The cooling air channel with the cooling element has the task of removing the heat from the interior space. The description is based on the proposal to create a cooling device functioning with cooling air containing fiber fly. The cooling action of the cooling device is not to be affected in spite of the fiber fly contained in the cooling air. The solution consists in letting the cooling air of the cooling air channel impact the cooling element of the cooling device at an angle. This solution therefore requires a cooling air channel extending at an angle, with the cooling device of the power electronics being placed in the area of the impact surface of the cool air flow, so that the cooling air is imparted a directional deflection as it impacts the cooling element and cooling thus becomes possible. The deflection makes it possible to prevent the flying fibers from being deposited on the cooling element thereby reducing the cooling action.

The air flow proceeds from the bottom up on the cooling element.

It is essential in this solution for all cooling elements of the power electronics to be installed on one and the same side of the cooling air channel so that the cooling air may impact all of the cooling elements and may be deflected. The number of cooling elements influences the cross-section and the structural height of the cooling air channel. It is a disadvantage with this solution that the cooling air Channel must form an angle. This requires special and sophisticated design of the cooling air channel.

The solution of EP 478 993 assumes great sophistication in equipment and design. It is characteristic here that the cooling elements for the power electronics are installed on one side wall of the cooling air channel and that the cooling air flows from the top down, one after the other, over the cooling elements of the power electronics. Since the cooling elements of the power electronics are placed one after the other along the cooling air channel, this has the disadvantage that the cooling air channel must be relatively high. It is a further disadvantage that all the power electronics are installed together with the information electronics in the cooling air channel and are therefore exposed to the entire fiber fly. This generally leads to short maintenance intervals with an increased number of malfunctions of the information electronics and higher cleaning costs.

OBJECTS AND SUMMARY OF THE INVENTION

It is a principal object of the instant invention to further and clearly reduce the sophistication of the design for heat removal from the interior spaces of a control cabinet of a textile machine of a spinning or winding line which are heated by the operation of electrical and electronic instruments. Additional objects and advantages of the invention will be set forth in part in the following description, or may be obvious from the description, or may be learned through practice of the invention.

It is a characteristic of the present invention that the cooling air channel is formed from several pipe-shaped segments. The pipe-shaped segment consists in the preferred embodiment of a four-sided segment. A pipe-shaped segment is formed by installing two inverted rectifier modules in the drawer of a frame. By being installed in the drawer of a frame, the cooling elements of two inverted rectifiers are placed in one and the same plane with the exception of a small interval, so that they constitute two complete sides of a pipe-shaped segment and the remaining sides of the segment are formed by the frame of the control cabinet. The inverted rectifier modules are installed in such a manner in the drawer of a frame that they tightly seal off the segment to be formed. The vertical arrangement of several such segments constitutes the cooling air channel, whereby the cooling elements are placed so that they are not only installed in the cooling air channel but at the same time constitute in part its side wall.

The arrangement can be obtained through the opposing placement of two inverting rectifier modules, with the inverted rectifiers being laterally offset in relation to each other, or being installed in alignment with each other. It is another characteristic that inverted rectifier modules may also be placed together in an insertion direction, with one inverting rectifier being rotated by 180°.

The present invention has the advantage that the cooling air channel is constituted in a simple manner by the inverted rectifier modules themselves. This advantageous device further makes it possible to reduce the height of the cooling air channel by approximately one half of the usual height.

Since the cooling air channel can be constructed in this modular manner, the utilization of additional inverting rectifier modules is possible when work stations of the textile machines are expanded without requiring additional designs. This modular construction of the cooling air channel makes it possible to take into account the wishes of individual customers with respect to the enlargement of the textile machine. An especially advantageous embodiment makes it possible to gain access to all inverting rectifier modules for maintenance or inspection from only one side of the control cabinet. An embodiment of the invention is shown in the drawings and is described in further detail below.

DETAILED DESCRIPTION OF THE PREFERRED EMBODIMENT

Reference will now be made in detail to the presently preferred embodiments of the invention, one or more examples of which are illustrated in the drawings. Each example us provided by way of explanation of the invention, and not as a limitation of the of the invention. Also, the numbering of components is consistent throughout the application, with the same component having the same number throughout.

From the many machines in the spinning industry, the open-end spinning machine (rotor spinning machine) was chosen for the embodiment given as an example. However, it should be understood that the present invention is in no way limited to only a rotor spinning machine.

Figure 1:
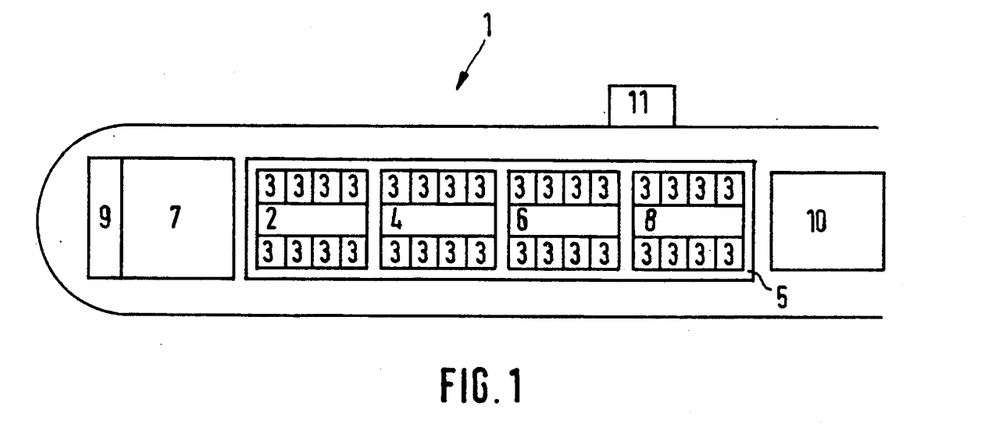
FIG. 1 shows a diagram of an open-end spinning machine.

As FIG. 1 shows, a known open-end spinning machine 1 is subdivided along its length into individual sections 2, 4, 6, 8. The individual section comprises individual spinning stations 3 as an assembly unit, and in practice approximately 20 spinning stations are contained in each section. Several sections 2, 4, 6, 8 assembled in a row constitute a section frame 5. By assembling the sections one after the other it is possible to install a central drive for the operating elements of the spinning stations 3. At the front of the section frame 5 is an electric service cabinet 7 the space of which is subdivided and which contains the central drive of the operating elements of the spinning stations, among other things. The electric service cabinet 7, which is also called a drive frame in practice, is as a rule also coupled to a tube loader 9 which ensures that the spinning stations 3 are supplied with empty tubes. At the opposite side of the section frame is the end section 10 with the bobbin removal mechanism. The end section 10 contains essentially electronics for the control and regulation of the machine. On a rail system (not shown in particular detail) on the open-end spinning machine 1 a rail-guided automatic travelling carriage 11 can travel around the machine so that it is able to switch from one machine side to the other.

Figure 2:
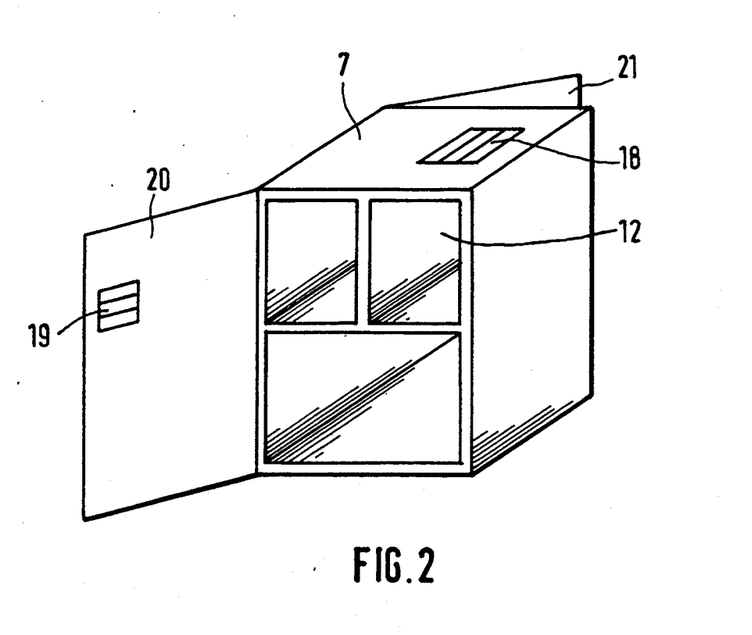
FIG. 2 shows an electrical service cabinet of an open-end spinning machine.

Among other things, the electric service cabinet 7 contains the housing of a control cabinet 12 (FIG. 2). This control cabinet 12 can be opened and closed from the right side of the machine, as well as from the left side, via a door 20 and 21. Vents 18 and 19 may also be included with the cabinet. According to FIG. 3, this control cabinet 12 is provided with a frame 13 which forms drawers 14, 15, 16, 17. Access to each individual drawer 14, 15, 16, 17 is possible through the doors 20 and 21 from the left as well as from the right machine side.

Figure 3:
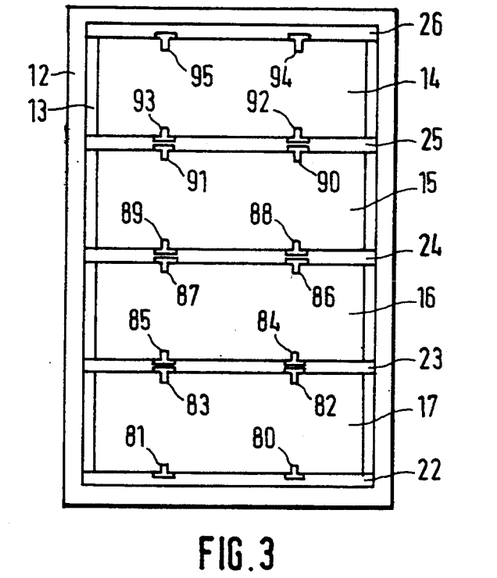
FIG. 3 shows the basic construction of a frame with drawers in the control cabinet.
Figure 4:
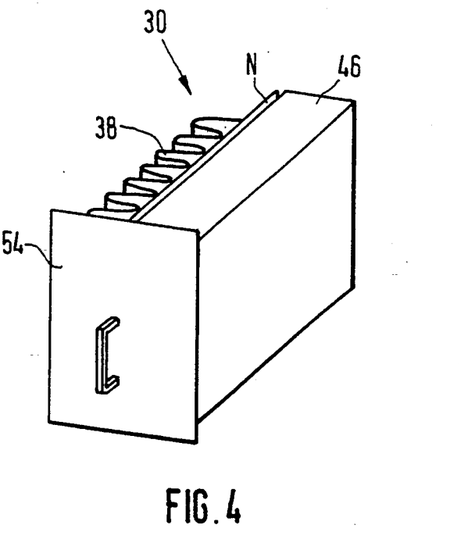
FIG. 4 is a diagram of an inverting rectifier module.

As FIG. 3 shows, the frame 13 consists of the horizontal supports 22, 23, 24, 25, 26, as well as of the horizontal supports which are covered in the plane of the picture but are located behind it. Two horizontal supports of an insertion plane constitute the supporting surface of a drawer. Transversal rails 80 to 95 are attached on the horizontal supports. The inverting rectifier module can be inserted on the transversal rails by their groove N (FIG. 4). At the horizontal supports of a drawer two stops are furthermore installed vertically but diagonally offset in relation to each other. The stops serve to limit the insertion distance of an inverting rectifier. The stops are not shown in FIG. 3 for the sake of clarity but are shown in part in FIG. 5 as stops 96, 97. Two inverting rectifier modules 30 are introduced in each individual drawer 14, 15, 16, 17.

FIG. 4 schematically shows an inverting rectifier module 30. It shows the inverting rectifier module 30 in a position in which it can be inserted into a drawer of frame 13. Schematically the power and information electronics 46 are installed within the shown space. The cooling element 38 which is connected mechanically to the power and information electronics 46 is located at the side. The cooling element 38 has metallic cooling ribs the intervals of which are perpendicular to the plane of the drawing. A groove N, which is also present on the underside of the shown inverting rectifier module, is provided between the cooling element 38 and the power and information electronics 46. Power and information electronics 46 and cooling element 38 are installed on a face plate 54. The other inverting rectifier modules are constructed similarly to this inverting rectifier module 30. Two inverting rectifier modules facing each other are inserted into one drawer.

Figure 5:
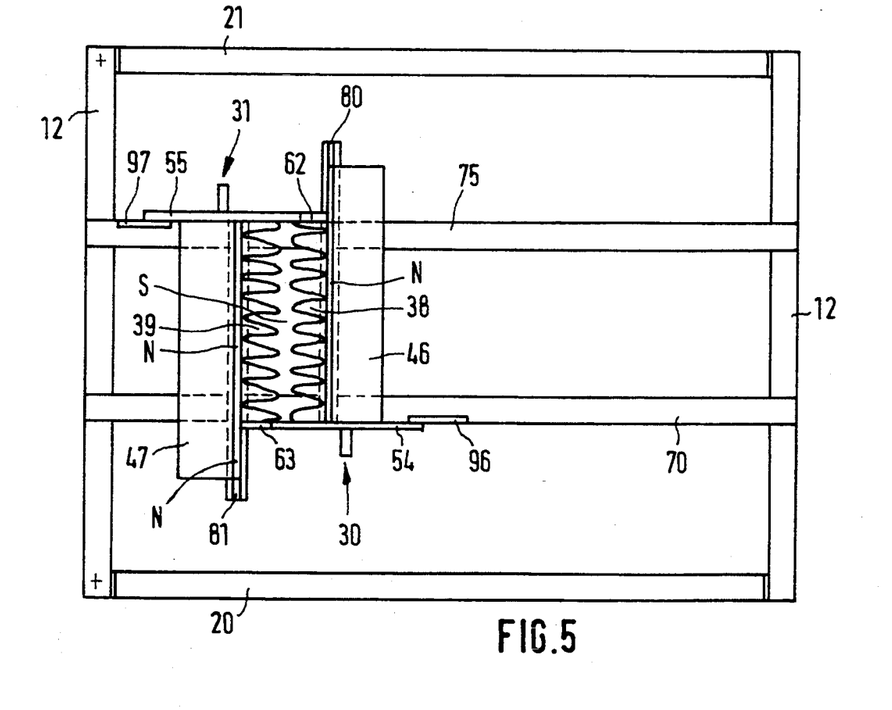
FIG. 5 shows a schematic layout of two inverting rectifier modules in a drawer of the control cabinet.

FIG. 5 shows a cutaway top view of the drawer 17 of the frame 13. The two inverting rectifier modules 30, 31 are inserted into the drawer 17 and supported by horizontal supports 70, 75.

As FIG. 5 further shows, a particularity of the invention consists in the fact that the two inverting rectifier modules 30, 31 are rotated by 180° in relation to each other in the plane of the drawer 17 and are at the same time laterally offset. In this manner one of the two inverting rectifier modules which are located together in the drawer 17 can always be inserted or removed from the facing door side. This opposing positioning has the advantage that the cooling elements 38, 39 of the two inverting rectifier modules 30, 31 face each other in one insertion plane up to a gap S. Each inverting rectifier module 30, 31 is provided with a face plate 54, 55 respectively. Each face plate has a handle by which the inverting rectifier module can be moved in and out of the drawer.

The arrangement of the two inverting rectifier modules 30, 31 is part of a segment Q1 of the cooling air channel K. The segment Q1 of the cooling air channel K is constituted by the cooling elements 38, 39, the wall segments 62, 63 and the face plates 54, 55. These components constitute four sides of the segment Q1 of the cooling air channel K. It is an original feature of the invention that every two cooling elements facing each other constituted themselves two of four sides. The sealing tightness between the upper and lower drawer is achieved by means of the transversal rails 80 to 95. FIG. 5 shows a seal by the transversal rail 80, 81. The inverting rectifier module 30 with its groove N lies on the transversal rail 80 and the inverting rectifier module 31 with its groove N lies on transversal rail 81.

Figure 6:
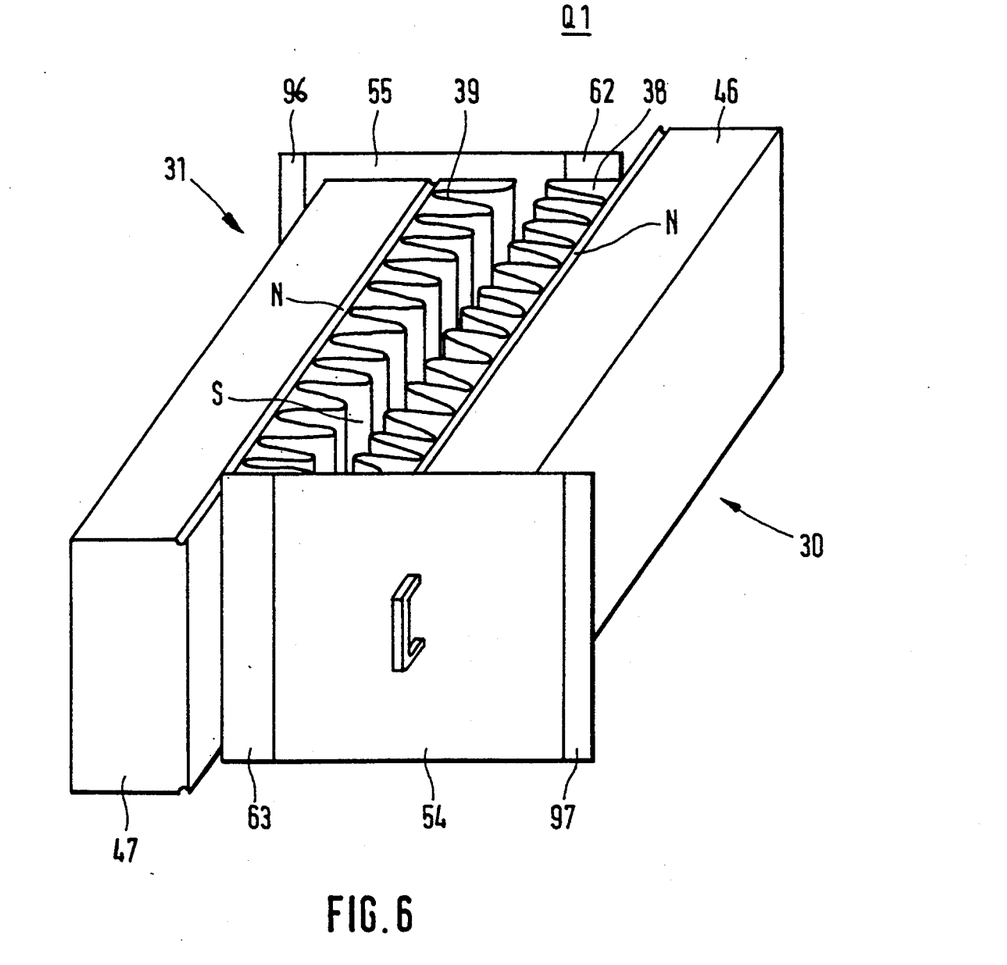
FIG. 6 shows a schematic diagram of a segment.

FIG. 6 schematically shows segment Q1. For segment Q1 the cooling air channel K is formed by the face plates 54 and 55, by wall segments 62 and 63 and by the cooling elements 38, 39. The two cooling elements 38, 39 do not touch each other but leave a small gap S. This gap S has advantages from the point of view of air flow technology. The placement of additional inverting rectifier modules 32 to 37 in the drawers 14, 15 and 16 (see FIG. 7) leads to analogous segments Q2, Q3, Q4 which make up the total height of the cooling air channel K in vertical arrangement.

Figure 7:
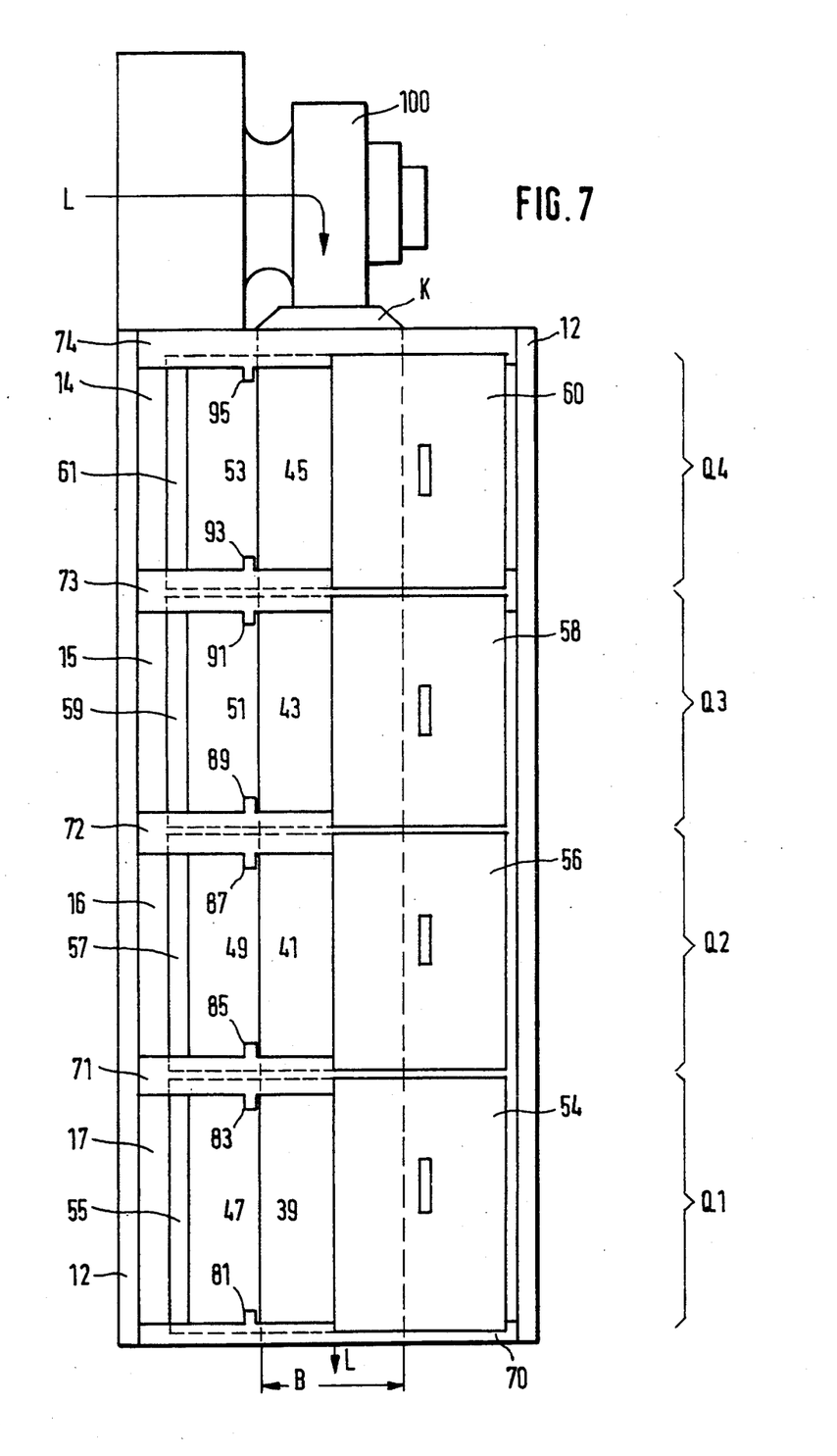
FIG. 7 shows the arrangement of the segments to make up a cooling air channel.

FIG. 7 shows such an arrangement of several inverting rectifier modules.

The cooling elements with the power and information electronics of the inverting rectifier modules are installed entirely within the cooling air channel K. In the drawing of FIG. 7 basically only the inverting rectifier modules with the cooling elements 39, 41, 43, 45 and the appertaining power and information electronics 47, 49, 51, 53 can be seen in a schematic representation. A portion of the back of their respective face plates 55, 57, 59, 61 is also visible. Of the other inverting rectifier modules, only the face plates 54, 56, 58, 60 are visible. The modules are supported on horizontal supports 70, 71, 72, 73, 74 as well as horizontal supports behind those illustrated. The width B indicates the width of the cooling air channel K. A blower 100 is installed above the cooling air channel K at the ventilation inlet 18 (FIG. 2). When the blower 100 is operated, the air L of the spinning hall is pressed down into the cooling air channel K in a high-volume flow and at high air speed, whereby the air L leaves the housing of the control cabinet 12 through the ventilation outlet of the housing of the control cabinet 12. This arrangement has the advantage that no cooling air channel need be installed in which the cooling elements of the inverting rectifier modules must be attached separately. The arrangement can be optionally expanded into a basic outfitting of inverting rectifier modules without having to use a design variant.

Instead of unused drawers, a so-called blind insert in the form of an face plate with a piece of sheet metal instead of an inverting rectifier module is inserted for sealing purposes so that the cooling air channel is sealed off towards the inside and the outside. For cleaning and maintenance each insert can be withdrawn easily and may be cleaned with compressed air, for instance.

Figure 8:
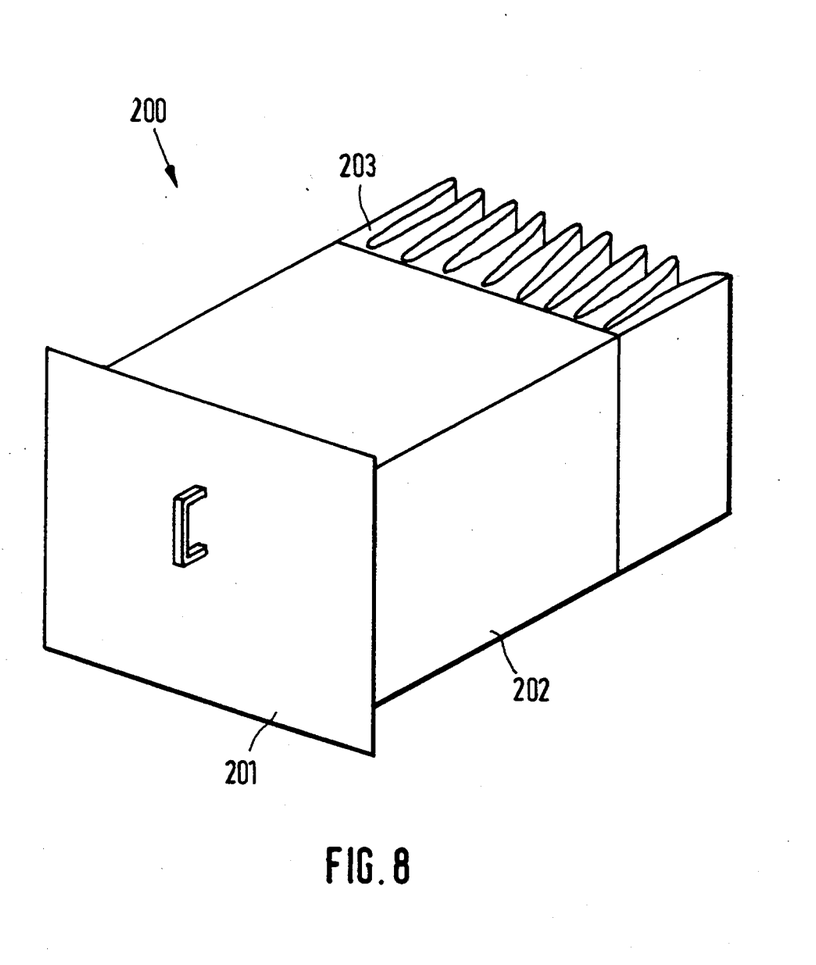
FIG. 8 is a diagram of a modified inverting rectifier module.
Figure 9:
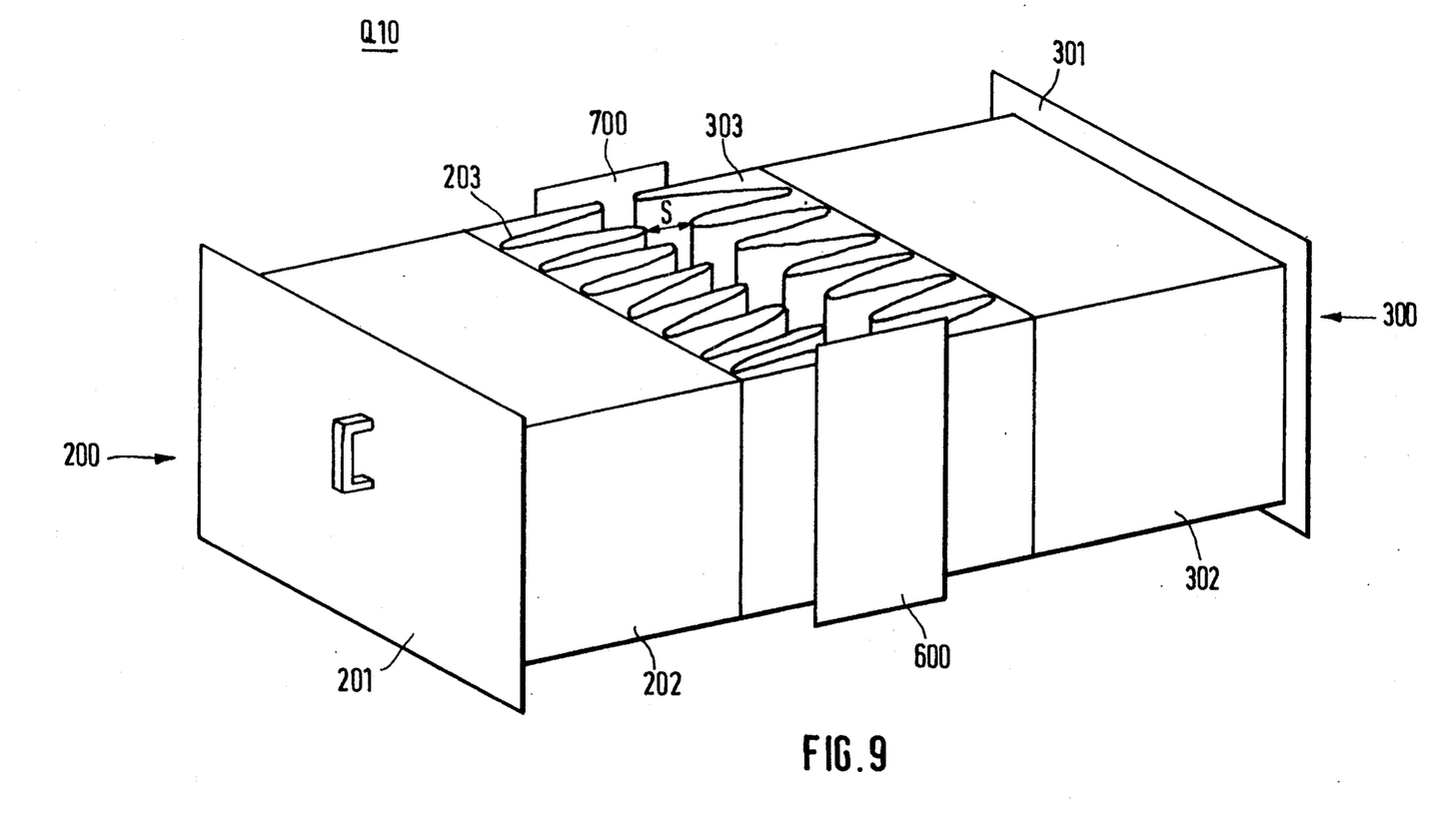
FIG. 9 shows a schematic diagram of a modified segment.

According to FIG. 8 a inverting rectifier module 200 with a configuration that is different from the inverting rectifier modules shown so far is known in practice. Based on the inverting rectifier module 200 according to FIG. 8, a different embodiment of the invention is described below. It is characteristic of the inverting rectifier module 200 that the power and information electronics 202 and the cooling element 203 are installed one after the other, starting out at the face plate 201. When such inverting rectifier modules, constructed in the manner of the inverting rectifier module 200, are used, it is proposed that a segment Q10 as shown in FIG. 9 be constituted. Two inverting rectifier modules 200 and 300 are inserted from two opposite sides of a drawer. The cooling element of the inverting rectifier module 200 is across from the cooling element of the inverting rectifier module 300. It must be ensured that a gap S is left also between the opposing cooling elements 203 and 303. The side walls 600, 700 are installed in the drawer of a frame and constitute the lateral covering of the cooling elements. Thus, the frame of the preceding embodiment must be modified. The drawer function of the frame is preserved. However the lateral walls 600 and 700 must be placed in such a manner in the frame that the cooling elements are tightly fitting and air tight when they have been placed in their final position after being inserted. No further details are shown in FIG. 9. The segment Q10 is formed of the cooling elements 203, 303 and the wall segments 600 and 700. If several such segments Q10 having the same configuration are arranged vertically, a cooling air channel is formed. At least two horizontally placed segments Q10 constitute a cooling air channel.

Figure 10:
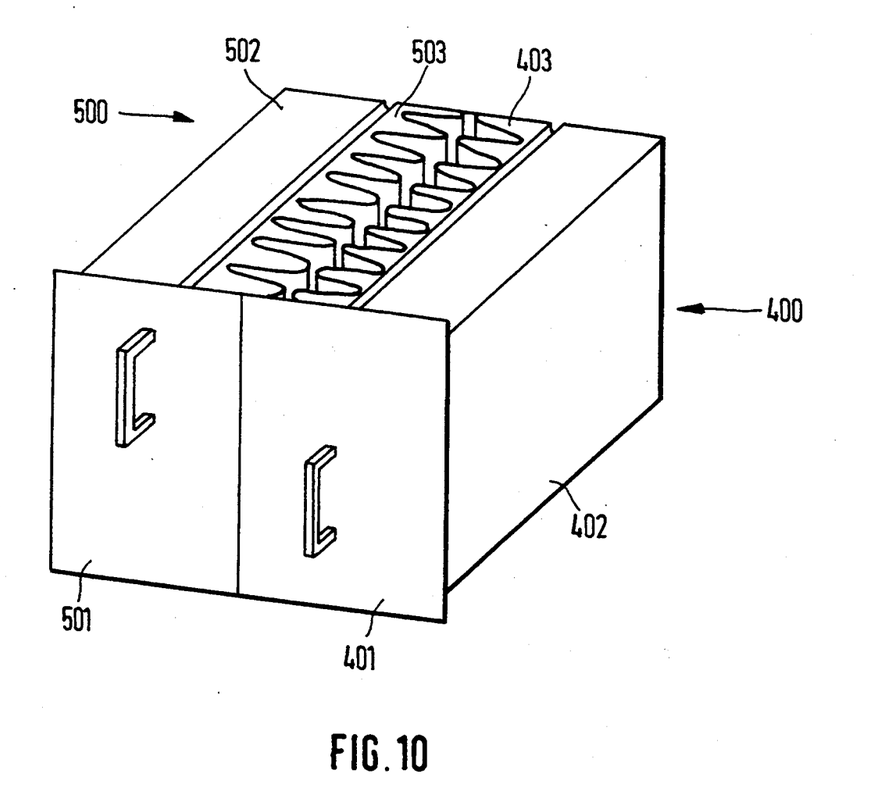
FIG. 10 schematically shows the placement of two inverting rectifier modules in one direction of insertion.

FIG. 10 shows a schematic arrangement of two inverting rectifier modules 400, 500 in an insertion direction, i.e. both inverting rectifier modules are inserted into the control cabinet 12 from one and the same side. The inverting rectifier modules 400, 500 constitute the segment Q100. When the inverting rectifier module 500 for instance is placed in its final position, the particularity consists in the fact that the inverting rectifier module 400 is placed in the same direction of insertion, but rotated by 180°.

For segment Q100 the cooling air channel is formed by the face plates 401, 501, the cooling elements 403, 503 and a wall segment not shown in FIG. 10 and representing the stop of the two inverting rectifier modules and which seals off the gap between the two cooling elements 403, 503.

It will be apparent to those skilled in the art that various modifications and variations can be made in the present invention without departing from the scope and spirit of the invention. For example, features illustrated or described as part of one embodiment can be used on another embodiment to yield a still further embodiment. It is intended that the present invention cover such modifications and variations as come within the scope of the appended claims and their equivalents.

I claim:

1. A textile machine control cabinet configured for efficiently removing heat generated therein by electronic powered modules, said cabinet comprising:

a frame structure, said frame structure comprising supports for a plurality of vertical drawer segments, each said drawer segment further comprising at least two electronic powered modules having attached cooling elements, said modules in each said drawer segment being adjacently disposed with their respective said cooling elements facing each other; and a vertically disposed cooling air channel defined within said control cabinet through said vertical drawer segments, said cooling air channel defined by vertically aligned multi-sided individual channels defined through each vertical drawer segment wherein at least two said multi-sided individual channels define said cooling air channel, each said multi-sided individual channel further comprising at least four sides wherein at least two of said sides are defined by said oppositely facing cooling elements.

2. The control cabinet as in claim 1, wherein said modules comprise inverting rectifier modules.

3. The control cabinet as in claim 1, wherein said modules are laterally offset so that a space is defined between said facing cooling elements.

4. The control cabinet as in claim 1, wherein each said module further comprises a face plate and a wall segment generally adjacent said face plate, two oppositely facing said sides of said multi-sided individual channels being defined by said face plates and said adjacent wall segments of said adjacently disposed modules.

5. The control cabinet as in claim 4, wherein said modules are laterally offset so that a gap is defined between said cooling elements.

6. The control cabinet as in claim 1, wherein said modules comprise face plates, said modules aligned at each said drawer segment with their respective said face plates oppositely facing, said cooling elements disposed lengthwise along each said module.

7. The control cabinet as in claim 1, wherein said modules comprise face plates, said modules aligned at each drawer segment with their respective said face plates being adjacent, said cooling elements disposed lengthwise along each said module.

8. The control cabinet as in claim 1, wherein said modules comprise face plates, said modules aligned at each said drawer segment with their respective said face plates being oppositely facing, said cooling elements disposed opposite said face plates along ends of said modules.

* * * * *